United States Patent

Jin et al.

[11] Patent Number: 5,846,366
[45] Date of Patent: Dec. 8, 1998

[54] METHOD FOR INTERCONNECTING AN ELECTRONIC DEVICE USING A TRANSFERABLE SOLDER CARRYING MEDIUM

[75] Inventors: Sungho Jin, Millington; Mark Thomas McCormack, Summit, both of N.J.

[73] Assignee: Lucent Technologies Inc., Murray Hill, N.J.

[21] Appl. No.: 698,284

[22] Filed: Aug. 14, 1996

Related U.S. Application Data

[63] Continuation of Ser. No. 251,548, May 31, 1994, abandoned.

[51] Int. Cl.$^6$ ................................................. B23K 31/02
[52] U.S. Cl. ................... 156/233; 156/234; 156/235; 156/297; 156/300; 228/180.22; 228/248.1
[58] Field of Search .................................... 156/230, 233, 156/234, 235, 297, 299, 300; 228/180.22, 248.1, 255

[56] References Cited

U.S. PATENT DOCUMENTS

| | | | |
|---|---|---|---|
| 4,605,461 | 8/1986 | Ogi | 156/234 X |
| 4,737,112 | 4/1988 | Jin et al. | 439/66 |
| 4,832,255 | 5/1989 | Bickford | 228/254 X |
| 5,076,485 | 12/1991 | MacKay | 156/297 X |
| 5,205,896 | 4/1993 | Brown et al. | 156/230 X |
| 5,217,597 | 6/1993 | Moore et al. | 205/123 X |
| 5,219,117 | 6/1993 | Lin | 228/253 X |
| 5,323,947 | 6/1994 | Juskey et al. | 156/297 X |

OTHER PUBLICATIONS

H. H. Manko *Soldering Handbook For Printed Circuits And Surface Mounting*.
IBM Technical Disclosure Bulletin, vol. 37, No. 4B, Apr. 1994, pp. 117–119.
IBM Technical Disclosure Bulletin, vol. 19, No. 6, Nov. 1976, p. 2049.
IBM Technical Disclosure Bulletin, vol. 17, No. 2, Jul. 1974, p. 627.

*Primary Examiner*—David A. Simmons
*Assistant Examiner*—Paul M. Rivard
*Attorney, Agent, or Firm*—Mathews, Collins, Shepherd & Gould

[57] ABSTRACT

In accordance with the invention, an electronic device having one or more contact pads is placed in contact with a carrier sheet bearing an array of transferable solder particles. Heat is applied to adhere the solder to the contact pads, and solder is selectively transferred onto the contact pads. In a preferred embodiment the solder-carrying medium comprises elastomeric material and the solder particles comprise solder-coated magnetic particles. Application of a magnetic field while the elastomer is curing produces a regular array of solder coated particles. Using this method, devices having smaller than conventional contact structures can be readily interconnected.

5 Claims, 4 Drawing Sheets

(a)

(b)

METHOD FOR INTERCONNECTING AN ELECTRONIC DEVICE USING A TRANSFERABLE SOLDER CARRYING MEDIUM

This application is a continuation of application Ser. No. 08/251,548 filed May 31, 1994 now abandoned.

FIELD OF THE INVENTION

This invention relates to methods for connecting electronic circuits and devices and, in particular, to such methods using an array of transferable solder particles disposed on a carrier sheet.

BACKGROUND OF THE INVENTION

All modern electronic products including computers, consumer electronics, telecommunication equipment and automobiles require circuit interconnection. While off-chip interconnection and packaging densities have improved over the years, the progress has been far slower than the improvement in on-chip semiconductor devices where the dramatic decrease in circuit feature size to the micron level has increased IC circuit densities from 250K to 64 MB in memory devices. The typical width of present-day circuit contact pads for solder interconnection is about 25 mils (625 $\mu$m) for printed circuit boards, and about 4 mils (100 $\mu$m) for silicon-on-silicon flip-chip devices. This enormous imbalance between the micron-level features of silicon devices and the hundreds-of-microns dimensions required for contact pads has forced very inefficient device integration. Around a small semiconductor element much "real estate" is wasted on fan-outs to larger-area, soldering contact pads. This fan out also results in longer travel path for electrons and hence slower device speed than could be realized with a compact, high-density interconnection scheme.

Most circuit board interconnections between mating contact pads utilize solder materials, such as the eutectic lead-tin solder (37Pb-63Sn). The solder materials are melted and solidified either by wave soldering or by surface mounting techniques. These techniques are described in "Soldering Handbook for Printed Circuits and Surface Mounting", by H. H. Manko, Van Nostrand Reinhold, New York, 1986, which is incorporated herein by reference. The surface mounting procedure is typically based on screen printing technology with the wet solder paste printed on each circuit pads of the substrate board to be solder interconnected. Alternatively, the solder may be deposited on each of the contact pads by physical or chemical vapor deposition or by electrochemical deposition, in combination with photolithography.

Two of the main technical barriers to the achievement of high or ultra-high density interconnections using smaller contact pad size are i) the absence of an industrially-viable technique for screen printing the solder paste below about 6 mil line width resolution and ii) the difficulty and high cost of large-area photolithography below the resolution of about 2 mil. Accordingly, there is a need for a new high density interconnection technology which is not restricted by screen printing or lithography. The present invention discloses such a technology.

SUMMARY OF THE INVENTION

In accordance with the invention, an electronic device having one or more contact pads is placed in contact with a carrier sheet bearing an array of transferable solder particles. Heat is applied to adhere the solder to the contact pads, and solder is selectively transferred onto the contact pads. In a preferred embodiment the solder-carrying medium comprises elastomeric material and the solder particles comprise solder-coated magnetic particles. Application of a magnetic field while the elastomer is curing produces a regular array of solder coated particles. Using this method, devices having smaller than conventional contact structures can be readily interconnected.

BRIEF DESCRIPTION OF THE DRAWINGS

The nature, advantages and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
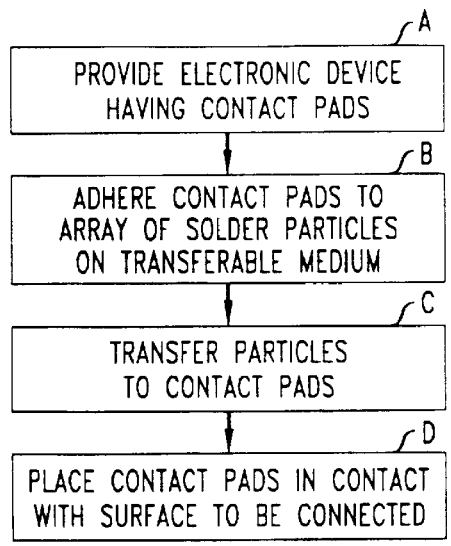
FIG. 1 is a block diagram showing the steps in making a high density connection.
Figure 2:
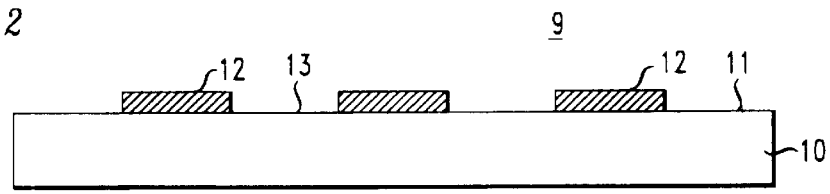
FIG. 2 schematically illustrates an electronic device having conductive contact pads.

Referring to the drawings, FIG. 1 is a block diagram showing the steps in making a high density connection in accordance with the invention. The first step shown in block A is to provide an electronic device having one or more contact pads. As shown in FIG. 2, such a device 9 typically comprises a substrate 10 having a substantially planar surface 11 including a plurality of conductive contact pads 12 rising above surface 11. The substrate 10 is typically a semiconductor wafer, an epoxy-based printed circuit board or a ceramic substrate. Contact pads 12 are typically coated copper. The pads can be coated with various metallic of polymer finishes for corrosion resistance and improved wetting of molten solder. Typical coatings are Au, Sn, solder and imidazole. The device can have numerous circuit elements (not shown) in the inter-pad areas 13.

Figure 3:
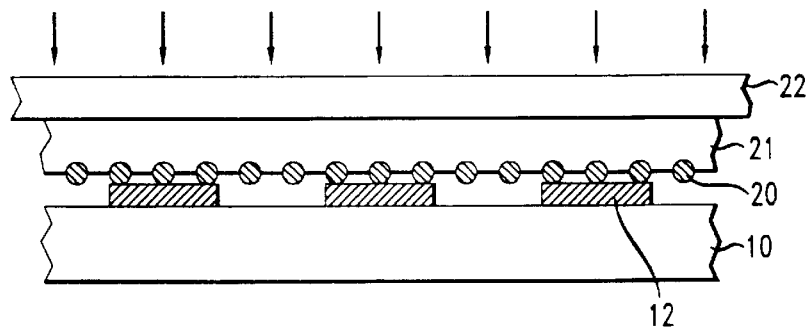
FIG. 3 is a schematic illustration of the device of FIG. 1 placed in contact with an array of transferable solder particles disposed on a carrier medium.

The next step, shown in block B of FIG. 1, is to adhere the contact pads to an array of solder particles transferably disposed on a carrier sheet. This step is illustrated in FIG. 3 where device 9 is contacted by an array of solder particles 20 partially embedded in a carrier sheet medium 21. The particles are adhered to the device contact pads by the application of heat. The protrusion of the solder particles 20 beyond the surface of the carrier medium 21 permits easy wetting of the solder to the metallic device pads 12. Advantageously, the carrier sheet can be provided with a backing layer 22, such as paper, for strength and easy handling. The substrate 10 can be pre-heated (and appropriately fluxed if necessary) before the carrier sheet is placed over it followed by application of vertical or sweeping pressure (e.g. by weight or roller action) to either tack or melt the solder particles 20 onto the contact pads 12 on the substrate 10. Alternatively, the carrier sheet can be heated together with the substrate under applied weight.

The dimension of the solder particles and contact pads are chosen such that only those solder particles facing the contact pads are tacked or melted, while the particles in the inter-pad areas 13 do not get tacked or melted onto the inter-pad areas. The surface of the inter-pad region is typically covered with non-metallic insulating materials such as polymer, and hence the solder is not easily tacked or melted onto it.

Figure 4:
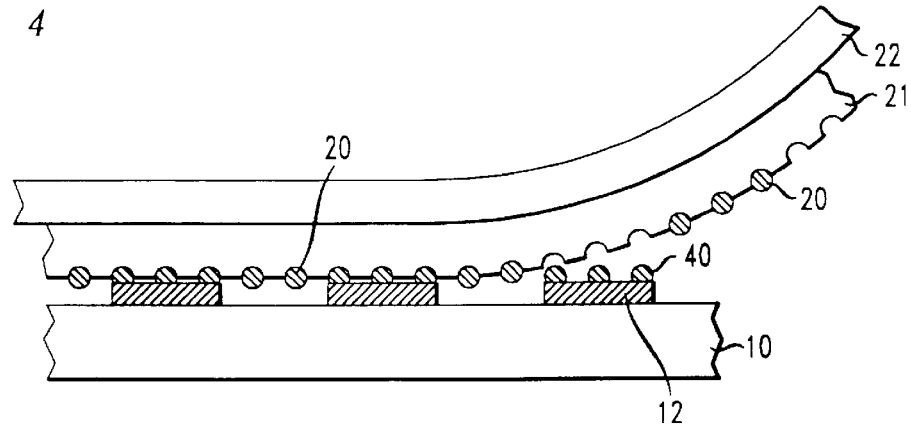
FIG. 4 shows the carrier medium being removed after protruding solder particles adhere to the contact pads.

The third step shown in block C of FIG. 1 is to selectively transfer the adhered solder particles to the contact pads. This step is illustrated in FIG. 4 where, after the solder particles 40 are adhered to the contact pads by tacking or melting, the carrier material that contained the solder particles is removed by peeling it away. The solder particles 20 that faced the inter-pad areas 13 remain embedded in the carrier material 21 and are removed together with the carrier. These solder particles remaining in the carrier can be easily extracted and recycled if desired.

The solder material can be any material with various desirable solder characteristics, e.g., appropriate melting point, solderability (wettability), mechanical, thermal, electrical properties, manufacturability and reliability. Known materials such as Pb-Sn solders including the most widely used eutectic 37Pb-63Sn, Bi—Sn, Sn—Ag, Sn—Sb, may be used, or new solder alloys such as described in U.S. patent application Ser. No. 08/020508, filed Feb. 22, 1993, and Ser. No. 08/055495, filed Apr. 30, 1993, may be used.

The solder particle shape is advantageously spherical as it is easy to reproducibly manufacture spheres of relatively uniform size and shape and to make the transferable carrier medium with relatively uniformly protruding particles. Desired size range of the solder particles is 0.2–200 $\mu$m, and preferably 0.5–50 $\mu$m. Fluxes such as RMA ("Rosin-Mildly-Activated") may be used, e.g., by spray coating on either the transferable solder medium or the substrate to improve the wetting of the solder onto the contact pad metal surface.

The carrier material can be made from a number of polymers, papers, or sheets of organic or inorganic materials. An example is an elastomer such as RTV 615 manufactured and sold by General Electric Co. The use of an elastomer is particularly advantages for two reasons. First the elastomer stretches out easily so that the solder particles tacked onto the contact pads slip out of the elastomer easily. Second the compliant nature of the elastomer, which accommodates some variation in pad height or substrate warpage, ensures most of the solder particles in the carrier medium will contact the pads during tacking operation. Alternatively, instead of elastomer, a tacky (or sticky) tape may also be used to carry the solder particles. In this case, an additional cleaning step after the solder tacking or melting may be needed in order to remove the left-over tacky polymer for desirable solderability during subsequent reflow interconnection. Suitable solvent to accomplish this cleaning step could be conveniently incorporated into the flux that will be applied before the reflow interconnection.

The support layer 22 can strengthen the carrier for easily handling, e.g., winding onto or unwinding from a spool. This support layer can be the same elastomer, plastic tape (e.g. polyethylene), paper or other sheet material. Advantageously layer 22 has a slightly tacky surface so that it adheres to the solder carrier sheet but can be peeled away from the solder carrier medium if desired.

Figure 5:
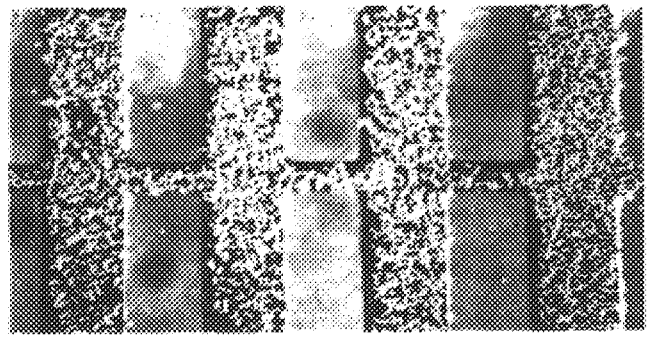
FIG. 5 is a photomicrograph at ×25 showing top view of the solder particles tacked on to the contact pads.

FIG. 5 is a photomicrograph representing a top view of the tacked solder particles (~50% surface coverage with ~35 $\mu$m diameter 37Pb-63Sn solder embedded in a 12 mil thick RTV carrier, which is then tacked by heating to 150° C./2 min. with ~2 psi weight, using a non-activated, water-white rosin flux) after the solder carrier sheet is removed. The solder particles are adherent to the 20 mil wide contact pad (Au-coated Cu-surface). The absence of the solder particles in the intra-pad region is evident.

Figure 6:
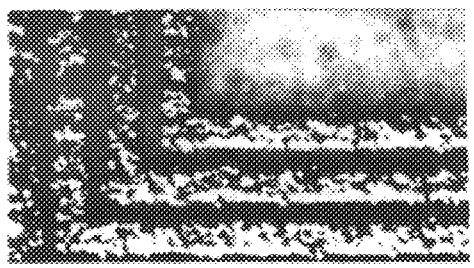
FIG. 6 is a photomicrograph at ×100 showing a top view of fine solder particles tacked onto 2 mil wide contact pad regions.

FIG. 6 is a photomicrograph showing a top view of finer solder particles (~50% surface coverage with ~10 $\mu$m size 37Pb-63Sn solder in an RTV carrier processed like the example of FIG. 5) tacked preferentially on 2 mil wide contact pad regions. The absence of solder in the inter-pad regions is again evident.

Figure 7:
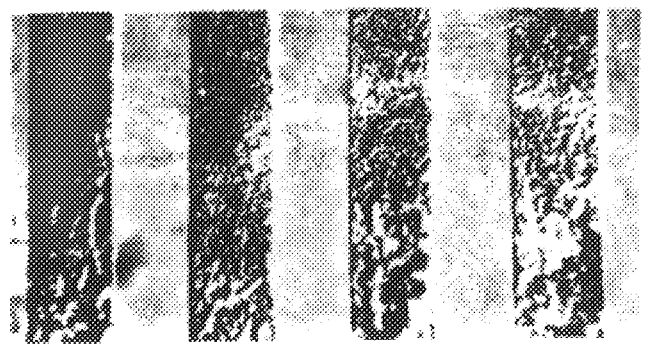
FIG. 7 is a photomicrograph showing the contact pads covered with solder as a result of melting of solder particles and preferential wetting of the contact pad regions.

FIG. 7 is a photomicrograph (top view) showing the contact pads essentially completely covered with solder as a result of melting of the 35$\mu$m diameter solder particles in FIG. 5 and preferential wetting of the contact pads. It is evident that the solder wets only the contact pads, leaving the inter-pad region devoid of solder.

Figure 8:
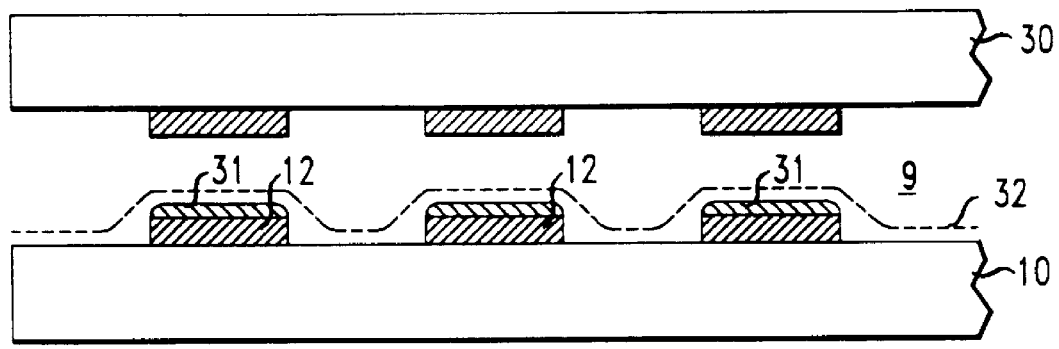
FIG. 8 illustrates the interconnection of a mating device onto the electronic device.

The fourth step in block D of FIG. 1 is to place the contact pads of the device 9 in contact with the surfaces of another device (such as another electronic device) to be connected to them. This is preferably accomplished, as shown in FIG. 8 in a subsequent reflow interconnection operation by bringing down the mating device 30 onto the device 9 and melting the solder 31. If desired, the mating surface of device 9 is coated with an appropriate flux 32. Any one of a number of known heating methods can be used, e.g., oven heating or infrared heating. The thickness of the solder layer can be increased, if desired, by applying the first three steps of FIG. 1 as many times as is needed in order to achieve proper solder joint size and geometry during reflow operation.

Figure 9:
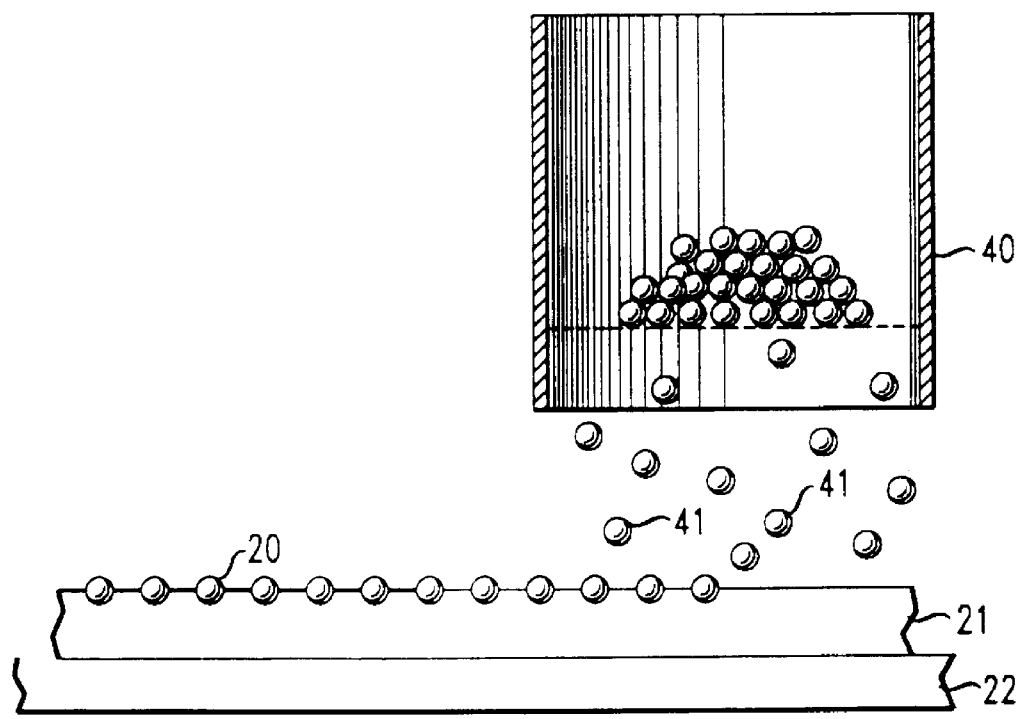
FIG. 9 schematically illustrates one method of making a solder-carrying medium.

There are a number of different ways of preparing the solder carrying medium. For example, the solder medium can be prepared by sprinkling of solder powder onto the surface of semi-cured, sticky carrier medium, or by spray coating the solder powder, spin coating it, or pressing down the sticky side of the medium onto the powder to tack solder particles. FIG. 9 schematically illustrates a sprinkling method using a sieve 40 to control the rate of drop of loose solder particles 41 onto medium 21. The sieve can be lightly tapped with desired intensity for optimum particle density on the carrier medium.

The medium 21, which is preferably a polymer such as an elastomer, may be used in the uncured state or partly cured to retain the solder particles placed on it. The viscosity and the surface tension of the elastomer can be adjusted, e.g., by choosing proper formula or by changing the exposure time or temperature of curing. This is to ensure that the solder particles are only partially embedded in the medium so that the part of the solder particle surface not coated with the polymer protrudes beyond the medium surface for easy transfer of solder to contact pad. An alternative way of ensuring the protrusion is to apply a layer, with controlled-thickness (preferably less than ½ of solder particle diameter), of uncured medium (not shown) on top of pre-cured medium, and then placing the solder particles onto the surface.

The composite structure with the typical solder particle burial depth of ~⅓ to ⅔ of the diameter is then cured for use as a transferable-solder medium. Another way is to use a tack tape with thin layer of tacky polymer or organic coating on the surface to hold the solder particles until they are transferred to the contact pads.

In order to minimize undesirable electrical shorting between adjacent contact pads, e.g., caused by statistically possible percolation of particles (stringer formation), the area fraction covered by solder particles in the transferable-solder medium is preferably restricted, to less than 60% coverage and more preferably less than 40% coverage. By repeating steps 1–3 of FIG. 1, the desired solder thickness can be built up without causing undesirable intra-pad shorting.

Figure 10:
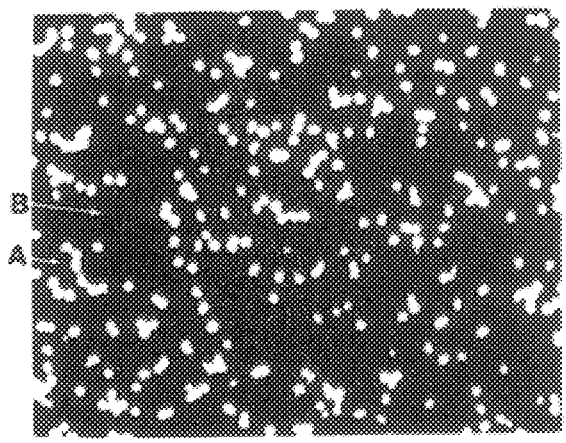
FIG. 10 is a photomicrograph of magnetic particles dispersed in a viscous medium in the absence of magnetic field.
Figure 10:
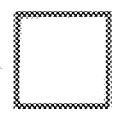
Figure 11:
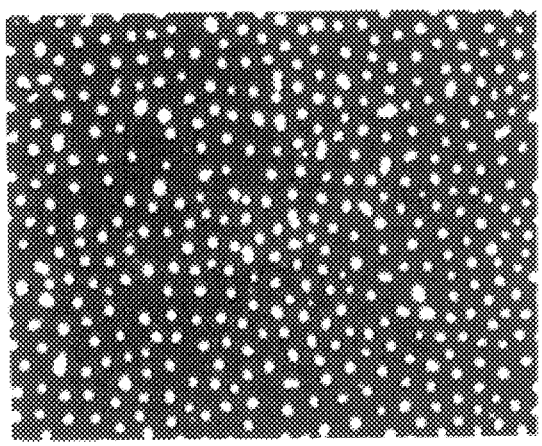
FIG. 11 is a photomicrograph similar to FIG. 10 except that a magnetic field was applied.

Preferably the probability of the shorting and the variation in solder amount is reduced by use magnetic separation. The solder particles can be magnetic particles coated with solder as by electroless coating of ferromagnetic particles. For example, if 5 $\mu$m thick layer or solder is coated on the surface of 7 $\mu$m diameter iron particles, the solder to iron volume fraction ratio would be about 4:1. In the presence of vertical magnetic field which is properly balanced against the surface tension of the matrix polymer, magnetic particles in a viscous medium can be made to repel each other and form a regular dispersion as shown in U.S. Pat. No. 4,737,112, issued to Jin et al. on Apr. 12, 1988, which is incorporated herein by reference. As shown in comparative micrographs of FIGS. 10 and 11, the presence of vertical magnetic field achieves a regular (uniform) dispersion of particles with very little stringer formation. After magnetic separation, the elastomer can be cured to produce the carrier medium.

The magnetic core could be any one of a number of ferromagnetic materials: relatively soft magnetic materials such as Fe, Ni, Co, Ni—Fe (permalloy), Ni—Zn ferrite, Mn—Zn ferrite, or permanent magnetic materials such as Fe—Al—Ni—Co (Alnico), Fe—C—Co, hexaferrites, rare-earth cobalt or Nd—Fe—B type magnets. The soft magnetic materials are easy to magnetize and hence are preferred. The metallurgical reaction between the solder material and the magnetic core material should be minimized so as not to inadvertently deteriorate the solder behavior and properties.

The inventive transferable-solder medium is also suitable for area-array interconnections as well as multi-layered three dimensional interconnection for high circuit density. The limitations in linewidth resolution encountered in conventional techniques are not present in the new interconnection methodology and fine-line, high-density contact pads can be easily and inexpensively coated.

We claim:

1. A method for connecting an electronic device having one or more electrical contact pads to a second device comprising the steps of:

providing said electronic device having one or more contact pads;

providing a carrier sheet having a plurality of solder balls transferably disposed thereon, said solder balls randomly distributed on said carrier sheet and having diameters in the range 0.5 to 50 $\mu$m;

adhering said device to solder balls on said carrier sheet to adhere a plurality of solder balls to each contact pad;

transferring the adhered solder balls to said contact pads; and placing the solder-carrying pads in contact with said second device.

2. The method of claim 1 wherein said solder balls are adhered to said contact pads by applying heat to said particles.

3. The method of claim 1 wherein said carrier sheet is flexible and said adhered solder is transferred by peeling said carrier sheet away from said electronic device.

4. The method of claim 1 wherein said carrier sheet comprises a layer of elastomeric material and said solder balls are partially embedded in said elastomeric material with protruding portions for contacting said pads.

5. The method of claim 1 wherein said solder balls comprise solder-coated magnetic particles.

* * * * *